US011159131B2

(12) United States Patent
Keil et al.

(10) Patent No.: US 11,159,131 B2
(45) Date of Patent: Oct. 26, 2021

(54) OPTOELECTRONIC COMPONENT INCLUDING A PHOTODETECTOR AND AN OPTICAL DAMPING MEMBER TO DAMP THE OPTICAL RADIATION PASSING TO THE PHOTODETECTOR

(71) Applicant: Sicoya GmbH, Berlin (DE)

(72) Inventors: Ulrich Keil, Berlin (DE); Stefan Meister, Berlin (DE); Marco Vitali, Berlin (DE); Lei Yan, Berlin (DE); Chenhui Jiang, Berlin (DE); Aws Al-Saadi, Berlin (DE); Hanjo Rhee, Berlin (DE)

(73) Assignee: SICOYA GMBH, Berlin (DE)

( * ) Notice: Subject to any disclaimer, the term of this patent is extended or adjusted under 35 U.S.C. 154(b) by 96 days.

(21) Appl. No.: 16/621,205

(22) PCT Filed: Jun. 13, 2018

(86) PCT No.: PCT/DE2018/200061
§ 371 (c)(1),
(2) Date: Dec. 10, 2019

(87) PCT Pub. No.: WO2018/233778
PCT Pub. Date: Dec. 27, 2018

(65) Prior Publication Data
US 2020/0212853 A1 Jul. 2, 2020

(30) Foreign Application Priority Data

Jun. 21, 2017 (DE) .................. 10 2017 210 375.2

(51) Int. Cl.
*H03F 3/08* (2006.01)

(52) U.S. Cl.
CPC .................. *H03F 3/087* (2013.01)

(58) Field of Classification Search
CPC ...... H03F 3/087; H04B 10/674; G02B 6/4201
(Continued)

(56) References Cited

U.S. PATENT DOCUMENTS

| 4,644,145 A | 2/1987 | Gündner |
| 6,025,947 A | 2/2000 | Sugaya et al. |

(Continued)

FOREIGN PATENT DOCUMENTS

| DE | 101 18 412 A1 | 10/2001 |
| EP | 1 056 230 A2 | 11/2000 |

(Continued)

OTHER PUBLICATIONS

Tai Tsuchizawa et al; "Monolithic Integration of Silicon-, Germanium-, and Silica-Based Optical Devices for Telecommunications Applications"; IEEE Journal of Selected Topics in Quantum Electronics; vol. 17, No. 3; May/Jun. 2011; pp. 516-525.

(Continued)

*Primary Examiner* — Que Tan Le
(74) *Attorney, Agent, or Firm* — Gordon Rees Scully; Mansukhani, LLP

(57) ABSTRACT

An optoelectronic device that includes at least one adjustable optical damping member arranged upstream of a photodetector and damps the optical radiation passing to the photodetector. The device is configured so that an electrical output of an amplifier is connected directly or indirectly to the adjustable optical damping member. An output signal of the amplifier or a control signal formed therewith drives the optical damping member, and the photodetector, the amplifier and the damping member are integrated in the same semiconductor substrate.

37 Claims, 11 Drawing Sheets

(58) Field of Classification Search
USPC .............................. 250/214 R, 214 A, 214.1
See application file for complete search history.

(56) References Cited

U.S. PATENT DOCUMENTS

| | | | |
|---|---|---|---|
| 7,936,999 B1* | 5/2011 | Hawryluck | H04B 10/60 |
| | | | 398/206 |
| 9,647,753 B1 | 5/2017 | Kurisu et al. | |
| 2002/0031066 A1 | 3/2002 | Okumura et al. | |
| 2004/0062557 A1 | 4/2004 | Takashima et al. | |

FOREIGN PATENT DOCUMENTS

| | | |
|---|---|---|
| EP | 1 056 230 A3 | 11/2000 |
| GB | 2 376 531 A | 12/2002 |

OTHER PUBLICATIONS

Hideki Nishizawa; "Design of a 10-Gb/s Burst-Mode Optical Packet Receiver Module and Its Demonstration in a WDM Optical Switching Network", Journal of Lightwave Technology, IEEE Service Center, New York, NY; vol. 20, No. 7; Jul. 1, 2002; pp. 1078-1083.

Behzad Razavi; "Design of Integrated Circuits for Optical Communications"; Second Edition; A John Wiley & Sons, Inc. Publication (WILEY); pp. 114-122. (2012).

Ahmed Awny et al.; "A 40 Gb/s Monolithically Integrated Linear Photonic Receiver in a 0.25 μm BiCMOS SiGe:C Technology"; IEEE Microwave and Wireless Components Letters; vol. 25, No. 7; Jul. 2015; pp. 469-471.

German Examination Report dated Feb. 23, 2018 issued in German Patent Application No. 10 2017 210 375.2 filed Jun. 21, 2017.

International Search Report dated Oct. 19, 2018 issued in International Application No. PCT/DE2018/200061; filed Jun. 13, 2018.

* cited by examiner

OPTOELECTRONIC COMPONENT INCLUDING A PHOTODETECTOR AND AN OPTICAL DAMPING MEMBER TO DAMP THE OPTICAL RADIATION PASSING TO THE PHOTODETECTOR

BACKGROUND

The invention relates to components comprising a photodetector and an amplifier and to methods for operating same.

The document "A 40 Gb/s Monolithically Integrated Linear Photonic Receiver in a 0.25 µm BiCMOS SiGe:C Technology" (Ahmed Awny, Rajasekhar Nagulapalli, Georg Winzer, Marcel Kroh, Daniel Micusik, Stefan Lischke, Dieter Knoll, Gunter Fischer, Dietmar Kissinger, Ahmet cagri Ulusoy, Lars Zimmermann; IEEE MICROWAVE AND WIRELESS COMPONENTS LETTERS, VOL. 25, NO. 7, JULY 2015) discloses a component comprising a photodetector and an electrical amplifier connected to the photodetector. The photodetector and the amplifier are integrated in the same semiconductor substrate.

The invention is based on the object of improving a component of the described type with regard to the quality of the electrical output signal that is output by the amplifier.

SUMMARY

This object is achieved according to the invention by means of a component having the features as claimed in patent claim 1. Advantageous configurations of the component according to the invention are specified in dependent claims.

Accordingly, the invention provides that at least one adjustable optical damping member is arranged upstream of the photodetector and damps or can at least damp the optical radiation passing to the photodetector, an electrical output of the amplifier is connected directly or indirectly to the adjustable optical damping member and an output signal of the amplifier or a control signal formed therewith drives the optical damping member, and the photodetector, the amplifier and the damping member are integrated in the same semiconductor substrate.

One major advantage of the component according to the invention can be seen in the fact that a setting of the radiation power incident on the photodetector is made possible by the adjustable optical damping member provided according to the invention. By way of example, if the optical input signal at the photodetector is very high and, in association therewith, the electrical input signal at the input of the amplifier is also very high, then a distortion of the electrical output signal(s) of the amplifier can occur for example as a result of the input stage of the amplifier being overdriven. Such a signal distortion as a result of the aforementioned overdriving can be avoided or at least reduced in a simple manner in the case of the component according to the invention by virtue of the fact that the adjustable optical damping member is used for limiting the optical input signal of the photodetector, i.e. the signal is already limited upstream of the input of the photodetector and the amplifier is protected as a result.

One preferred configuration of the component provides for the control device to drive the damping member in such a way that the electrical input signal at the amplifier input of the amplifier has a predefined characteristic and/or the amplifier exhibits a predefined behavior.

Alternatively or additionally, it can advantageously be provided that the control device drives the damping member in such a way that the average signal strength of the electrical input signal at the amplifier input of the amplifier is limited to a predefined maximum value.

Alternatively or additionally, it can advantageously be provided that the control device drives the damping member in such a way that the signal peaks of the electrical input signal at the amplifier input of the amplifier are limited to a predefined maximum value.

Alternatively or additionally, it can advantageously be provided that the control device drives the damping member in such a way that the signal strength of the electrical input signal at the amplifier input of the amplifier falls below or at least does not exceed a predefined nominal input signal strength.

Alternatively or additionally, it can advantageously be provided that the control device drives the damping member in such a way that the amplifier operates in the linear amplifier range or is at least not overdriven.

Alternatively or additionally, it can advantageously be provided that the control device drives the damping member in such a way that an input circuit, in particular a bipolar input transistor, of the amplifier is operated with an input voltage below the breakdown voltage thereof.

Alternatively or additionally, it can advantageously be provided that the control device drives the damping member in such a way that an input circuit, in particular a bipolar input transistor, of the amplifier is operated with input voltages outside the saturation range thereof.

Alternatively or additionally, it can advantageously be provided that the control device drives the damping member in such a way that the third harmonic in the output signal of the amplifier falls below or at least does not exceed a predefined signal threshold for the third harmonic.

Alternatively or additionally, it can advantageously be provided that the control device drives the damping member in such a way that the 1 dB compression point is not reached at the output of the amplifier. The compression point quantitatively describes the nonlinear behavior of an amplifier; it defines the largest amplitude of the input signal for which the distortions brought about by nonlinearity do not yet exceed a predefined measure.

The photodetector, the amplifier and the damping member preferably form a closed control loop.

Preferably, a control device is electrically connected between the electrical output of the amplifier and the optical damping member, the electrical output signal output at the output of the amplifier being applied to said control device on the input side and said control device outputting on the output side the electrical control signal for driving the optical damping member.

The photodetector, the amplifier, the control device and the damping member preferably form a closed control loop.

The control device preferably comprises an operational amplifier.

Alternatively or additionally, it can be provided that the control device comprises a memory with a stored table, which predefines electrical control signals to be output depending on the output signal output by the amplifier.

Preferably, the electrical output of the amplifier, which is directly or indirectly connected to the adjustable optical damping member, is a signal strength indicator output, which outputs as the output signal a signal indicating the average signal strength at the amplifier input, or a signal peak detector output, which outputs as the output signal a signal indicating the magnitude of the signal peaks of the output signal of the amplifier.

Moreover, provision can be made for the amplifier to have at least two electrical outputs, namely the output directly or indirectly connected to the adjustable optical damping member, and a data signal output for outputting a data signal.

With regard to the construction of the component, it is considered to be advantageous if a waveguide is optically coupled or connected to the photodetector and the optical damping member acts on the waveguide. The waveguide, the photodetector and the optical damping member are preferably integrated in the same semiconductor substrate.

Moreover, it can be advantageous if the photodetector has two or more optical inputs, to which a respective waveguide is connected.

Each of the at least two waveguides connected to the photodetector is preferably equipped in each case with an adjustable optical damping member, which is coupled indirectly or directly to the or one of the outputs of the amplifier and is driven indirectly or directly via an output signal of the amplifier.

The adjustable optical damping member can advantageously have a charge carrier injection device, in particular a pn or pin diode structure, or a heating device or both a charge carrier injection device and a heating device.

By way of example, provision can be made for a charge carrier injection device and/or a heating element to be present in each case in each of the two waveguide arms of a Mach-Zehnder structure. Such an arrangement enables operation (e.g. "push-pull" operation) in which optionally only one of the two waveguide arms is driven with a desired sign of the change in refractive index or both waveguide arms are driven simultaneously, preferably in opposite senses or with a different sign of the change in refractive index.

Alternatively or additionally, it can be provided that the waveguide has an interference structure, in particular a Mach-Zehnder structure or a directional coupler structure, and/or a resonator structure, in particular a Fabry-Perot resonator structure or a ring resonator structure, and the adjustability of the damping of the optical damping member is at least also based on a variation of the refractive index in a section of the interference structure and/or the resonator structure.

The amplifier is preferably a transimpedance amplifier, in particular one which is integrated in the same substrate as the photodetector.

Furthermore, it is considered to be advantageous if a waveguide is optically coupled or connected to the photodetector, and in and/or alongside the waveguide two or more optical damping members are arranged one behind another in the longitudinal direction of the waveguide, which damping members act or can at least act in each case on the waveguide, wherein each of the damping members is connected in each case indirectly or directly to the or one of the electrical outputs of the amplifier, in particular to the same output of the amplifier, and is driven with an output signal of the amplifier, in particular the same output signal, or a control signal formed therewith.

Moreover, it is advantageous if the photodiode is electrically differentially connected to the amplifier.

The invention furthermore relates to a method for operating a component comprising a photodetector and an electrical amplifier connected to the photodetector.

With regard to such a method, according to the invention it is provided that an adjustable optical damping member is driven with an output signal output at an electrical output of the amplifier or with a control signal formed therewith and the damping of said damping member is set, and the radiation incident on the photodetector is damped by the damping member, wherein the photodetector, the amplifier and the damping member are integrated in the same semiconductor substrate.

With regard to the advantages of the method according to the invention, reference should be made to the above explanations in association with the component according to the invention.

It is advantageous if the damping is set in such a way that the electrical input signal at the amplifier input of the amplifier has a predefined characteristic and/or the amplifier exhibits a predefined behavior.

Alternatively or additionally, it can advantageously be provided that the damping is set in such a way that the average signal strength of the electrical input signal at the amplifier input of the amplifier is limited to a predefined maximum value.

Alternatively or additionally, it can advantageously be provided that the damping is set in such a way that the signal peaks of the electrical input signal at the amplifier input of the amplifier are limited to a predefined maximum value.

Alternatively or additionally, it can advantageously be provided that the damping is set in such a way that the signal strength of the electrical input signal at the amplifier input of the amplifier falls below or at least does not exceed a predefined nominal input signal strength.

Alternatively or additionally, it can advantageously be provided that the damping is set in such a way that the amplifier operates in the linear amplifier range or is at least not overdriven.

Alternatively or additionally, it can advantageously be provided that the damping is set in such a way that an input circuit, in particular a bipolar input transistor, of the amplifier is operated with an input voltage below the breakdown voltage thereof.

Alternatively or additionally, it can advantageously be provided that the damping is set in such a way that an input circuit, in particular a bipolar input transistor, of the amplifier is operated with input voltages outside the saturation range thereof.

Alternatively or additionally, it can advantageously be provided that the damping is set in such a way that the third harmonic in the output signal of the amplifier falls below or at least does not exceed a predefined signal threshold for the third harmonic.

Alternatively or additionally, it can advantageously be provided that the damping is set in such a way that the 1 dB compression point is not reached at the output of the amplifier.

Alternatively or additionally, it can advantageously be provided that the damping is set in such a way that the output signal at the output of the amplifier does not exceed a predefined threshold value.

BRIEF DESCRIPTION OF THE DRAWINGS

The invention is explained in greater detail below on the basis of exemplary embodiments; in this case in the figures by way of example

DETAILED DESCRIPTION

In the figures, the same reference signs are always used for identical or comparable component parts, for the sake of clarity.

Figure 1:
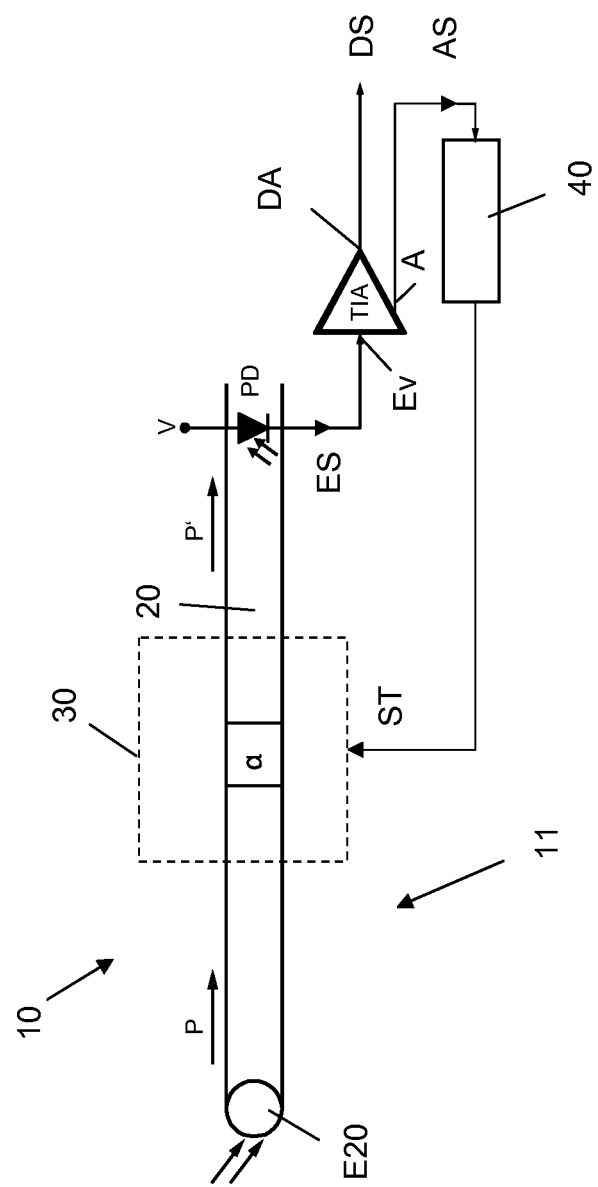
FIG. 1 shows one exemplary embodiment of a component according to the invention which is equipped with a damping member arranged upstream of a photodetector of the component in the light propagation direction.

FIG. 1 shows a component 10 comprising a photodetector (PD) and an electrical amplifier TIA connected to the photodetector PD. The amplifier TIA is preferably a transimpedance amplifier.

An optical waveguide 20 is disposed upstream of the photodetector PD, to which an electrical potential V is applied, the input E20—on the left in FIG. 1—of said waveguide being suitable for feeding in optical radiation P. The optical radiation P passes through the waveguide 20 in the direction of the photodetector PD. On the way to the photodetector PD, the optical radiation is influenced by a damping member 30, which is preferably integrated into the waveguide 20 or coupled thereto and damps the optical radiation P, as a result of which damped radiation identified by the reference sign P' in FIG. 1 is formed.

In the case of the exemplary embodiment in accordance with FIG. 1, the amplifier TIA has a data signal output DA, which outputs on the output side a data signal DS communicated by means of the optical radiation P.

The amplifier TIA furthermore has an output A, the output signal AS of which is fed into a control device 40 of the component 10. With the output signal AS of the amplifier TIA, the control device 40 generates a control signal ST, with which the damping member 30 is driven or the damping a thereof is set.

The abovementioned component parts of the component 10, that is to say the waveguide 20, the damping member 30, the control device 40, the photodetector PD and the amplifier TIA, are integrated into one and the same semiconductor substrate 11 of the component 10.

The light power impinging on the photodetector PD can be limited by control of the change in transmission of the damping member 30. Limiting the light power can prevent the input stage of the amplifier TIA being overdriven. Overdriving of the input stage with an excessively high input signal can result in a distortion of the data signal DS in a disturbing manner. Said distortion can arise as a result of an excessively high voltage swing that drives the input transistor of the amplifier TIA to saturation.

In a system having a plurality of parallel channels, a high signal can additionally result in increased crosstalk between adjacent channels. Said crosstalk reduces the effective input sensitivity of the input amplifier of the amplifier TIA.

For the reasons mentioned, the component 10 is preferably operated in such a way that the photodetector PD, the amplifier TIA, the control device 40 and the damping member 30 form a closed control loop. Specifically, the control device 40 will perform the driving of the damping member 30 preferably in such a way that the average signal strength of the electrical input signal ES at the amplifier input Ev of the amplifier TIA is limited to a predefined maximum value. Alternatively, the control device 40 can advantageously also be configured in such a way that it operates the control loop in such a way that the signal peaks in the electrical input signal ES at the amplifier input Ev of the amplifier TIA are limited to a predefined maximum value.

In order to enable the described mode of operation of the control device 40 in a particularly simple manner, it is considered to be advantageous if the electrical output A of the amplifier TIA, which is connected to the control device 40, is a signal strength indicator output, which outputs as the output signal AS an output signal AS indicating the average signal strength at the amplifier input Ev of the amplifier TIA.

Alternatively, it is considered to be advantageous if the electrical output A of the amplifier TIA outputs as output signal AS a signal indicating the magnitude of the signal peaks at the amplifier input Ev of the amplifier TIA.

Figure 2:
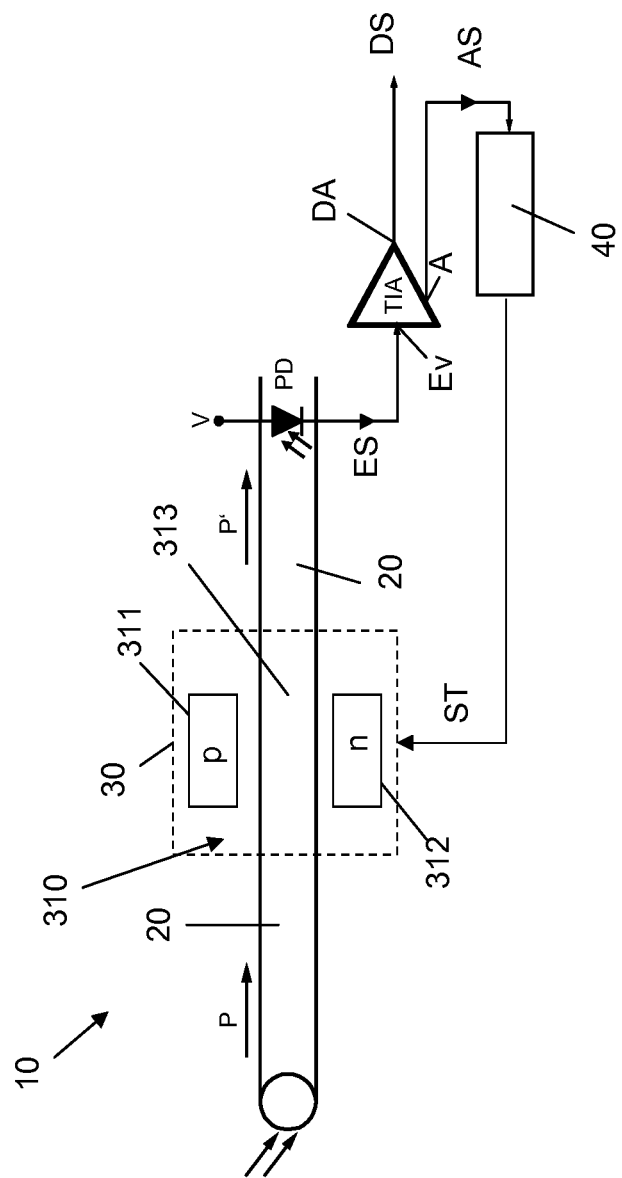
FIG. 2 shows one exemplary embodiment of a component according to the invention in which a damping member is formed by a charge carrier injection device, which brings about damping of optical radiation by charge carrier injection.

FIG. 2 shows one exemplary embodiment of a component 10 which corresponds to the component 10 in accordance with FIG. 1 in terms of the construction. In this regard, FIG. 2 reveals that the component 10 in accordance with FIG. 2 comprises a waveguide 20, a damping member 30, a photodetector PD, an amplifier TIA and a control device 40. The damping member 30, the photodetector PD, the amplifier TIA and the control device 40 form a control loop that is used to set the damped optical power P' incident on the photodetector PD to a desired measure, as has already been explained in association with FIG. 1.

In the case of the exemplary embodiment in accordance with FIG. 2, the damping member 30 is formed by a charge carrier injection device 310 comprising a p-doped region 311, an n-doped region 312 and an intervening undoped or only weakly doped central region 313, through which the waveguide 20 is led.

In order to control the damping of the damping member 30 in accordance with FIG. 2, the control device 40 can allow more or less current (or even no current at all) in the form of the control signal ST to flow through the charge carrier injection device 310 or the pn or pin diode thereof; depending on the current magnitude, the density of charge carriers within the central region 313 is set accordingly and, as a result, the damping of the radiation is set to the respectively desired measure by means of the charge carriers in the region 313. Without current, the absorption is equivalent to the absorption of the waveguide 20 itself (approximately 2 dB/cm) and is negligible over typical distances of a few tens of micrometers between the damping member 30 and the photodetector PD.

For the rest, the above explanations in association with FIG. 1 are correspondingly applicable.

Figure 3:
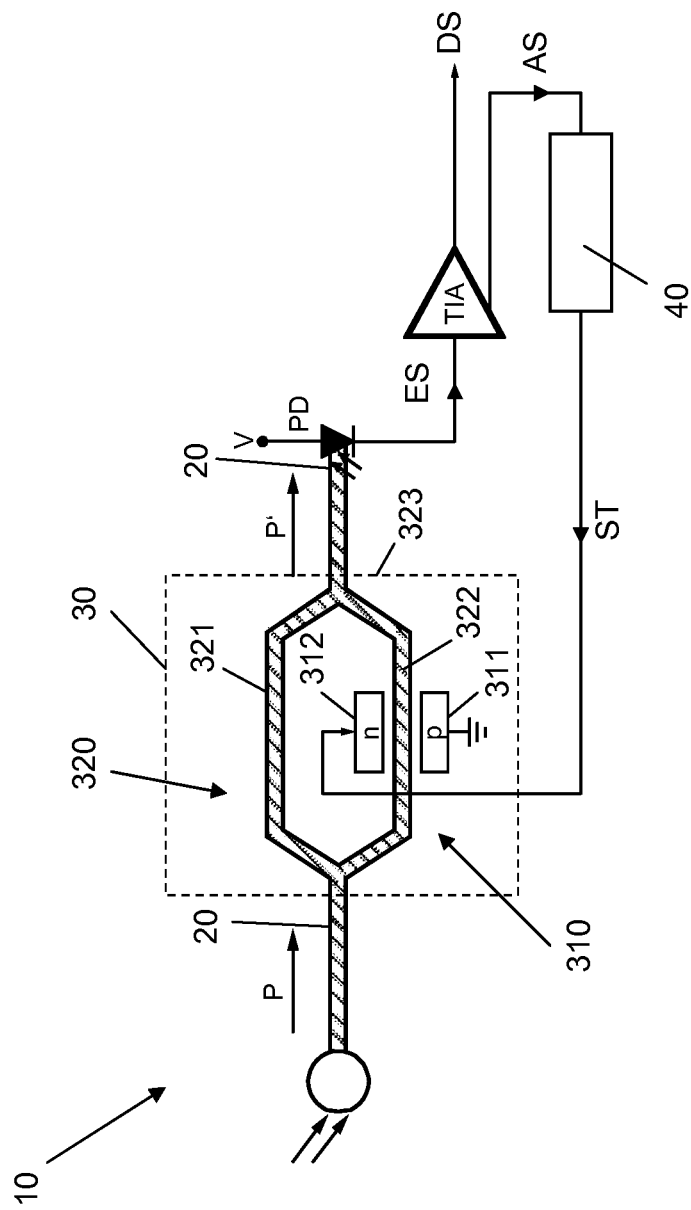
FIG. 3 shows one exemplary embodiment of a component according to the invention in which a damping member has a Mach-Zehnder structure and a charge carrier injection device, the injected charge carriers of which bring about a change in refractive index and thus a change in the interference at the output of the Mach-Zehnder structure.

FIG. 3 shows one exemplary embodiment of a component 10 in which a damping member 30 is formed by a Mach-Zehnder structure 320. The Mach-Zehnder structure 320 comprises two waveguide arms 321 and 322 running parallel. One of the two waveguide arms, for example the lower waveguide arm 322 in FIG. 3, is equipped with a charge carrier injection device 310, which can correspond to the charge carrier device 310 in accordance with FIG. 2.

The charge carrier injection device 310 in accordance with FIG. 3 also has a p-doped region 311 and an n-doped region 312, which form a pn or pin diode structure, through which charge carriers can be fed into the waveguide arm 322.

In contrast to the exemplary embodiment in accordance with FIG. 2, in which the damping of the damping member 30 is brought about by the charge carrier damping of the injected charge carriers, the exemplary embodiment in accordance with FIG. 3 provides for the charge carriers injected by the charge carrier injection device 310 primarily to vary the refractive index in the region of the waveguide arm 322, thus resulting in a phase shift of the optical radiation between the two waveguide arms 321 and 322. Depending on the resulting phase shift at the output 323 of the Mach-Zehnder structure 320, on account of the interference the radiation is coupled out in a phase-shift-dependent manner and this is accompanied by a phase-shift-dependent amplitude of the radiation P' radiated into the photodetector PD, said radiation thereby being damped to a greater or lesser extent.

To summarize, the damping member 30 is thus based on a change in refractive index as a result of charge carrier injection, in contrast to the damping member 30 in accordance with FIG. 2, in which the damping is based on the damping by the charge carriers themselves.

In the case of the exemplary embodiment in accordance with FIG. 3, the phase shift between the waveguide arms 321 and 322 can alternatively or additionally also be brought about by a heating element 500, which causes a change in refractive index as a result of a temperature change.

Figure 11:
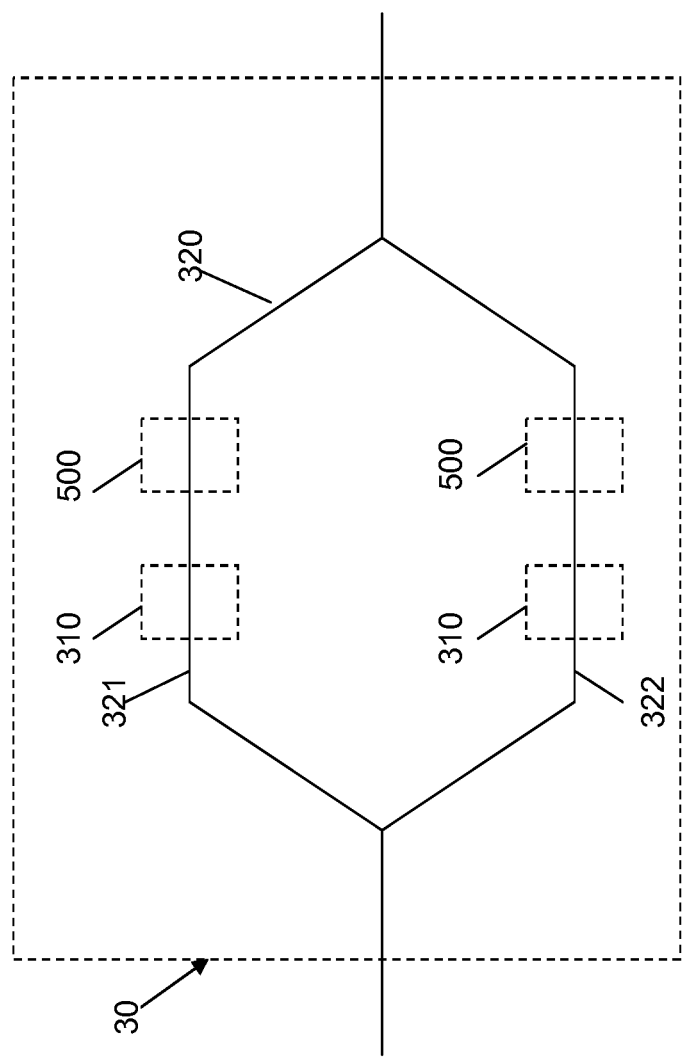
FIG. 11 shows one embodiment variant for a damping member in which changes in refractive index having a different sign can be applied to two waveguide arms of a Mach-Zehnder structure, for example for push-pull operation.

It is possible, moreover, to provide in each case a charge carrier injection device 310 and/or a heating element 500 (e.g. in the form of an electrical resistor or an electrical resistance layer) in each of the two waveguide arms 321 and 322 of the Mach-Zehnder structure 320 in order to enable for example operation (e.g. "push-pull" operation) in which optionally only one of the two waveguide arms 321 and 322 is driven with a desired sign of the change in refractive index or both waveguide arms 321 and 322 are driven simultaneously, preferably in opposite senses or with a different sign of the change in refractive index. Such a variant is shown by way of example in FIG. 11.

Figure 4:
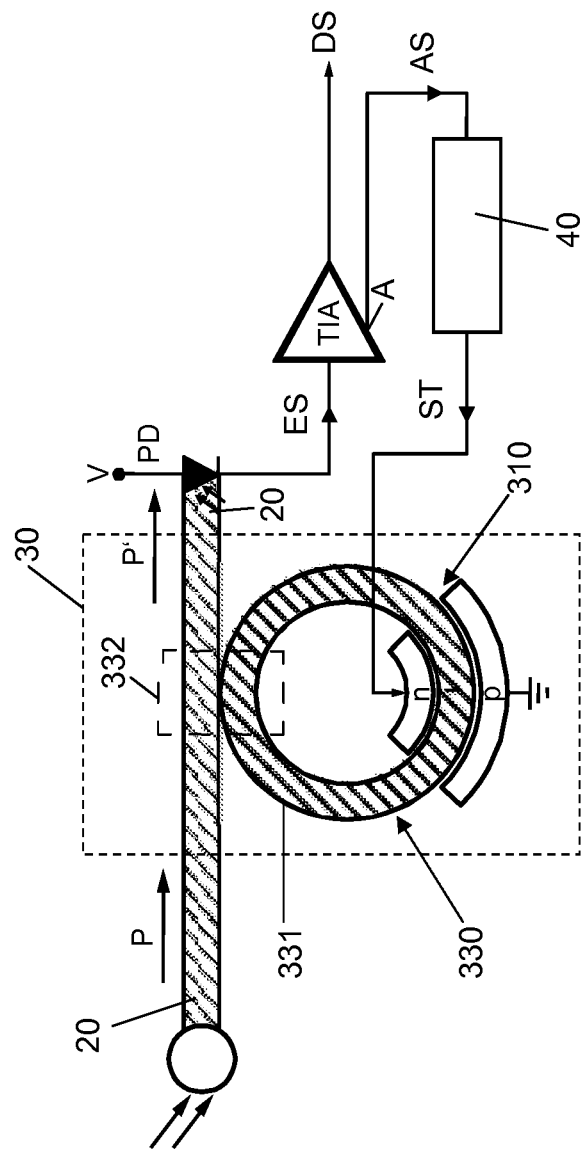
FIG. 4 shows one exemplary embodiment of a component according to the invention in which a damping member has a ring resonator and a charge carrier injection device.

FIG. 4 shows one exemplary embodiment of a component 10 in which a damping member 30 comprises a ring resonator 330. The ring resonator 330 has a waveguide ring 331 and a directional coupler 332, which couples the waveguide ring 331 to the waveguide 20 of the component 10.

Furthermore, the damping member 30 in accordance with FIG. 4 has a charge carrier injection device 310, for example one such as has already been explained above in association with FIGS. 2 and 3. The charge carrier injection device 310 makes it possible to feed charge carriers into the waveguide ring 331, as a result of which the effective optical length thereof is varied (owing to the change in refractive index) and the coupling behavior relative to the waveguide 20 is altered. In the case of the component 10, the control device 40 thus has the possibility of influencing, by means of the control signal ST or by means of suitable charge carrier injection into the waveguide ring 331, the coupling behavior of the ring resonator 330 relative to the waveguide 20 and thus of setting in a targeted manner the optical power impinging on the photodetector PD, depending on the output signal AS at the output A of the amplifier TIA.

With regard to optimum regulation of the damping of the damping member 30, reference should be made to the explanations above, particularly in association with FIG. 1.

In the case of the exemplary embodiment in accordance with FIG. 4, the phase shift in the waveguide ring 331 can alternatively or additionally also be brought about by a heating element 500, which causes a change in refractive index as a result of a temperature change.

Figure 5:
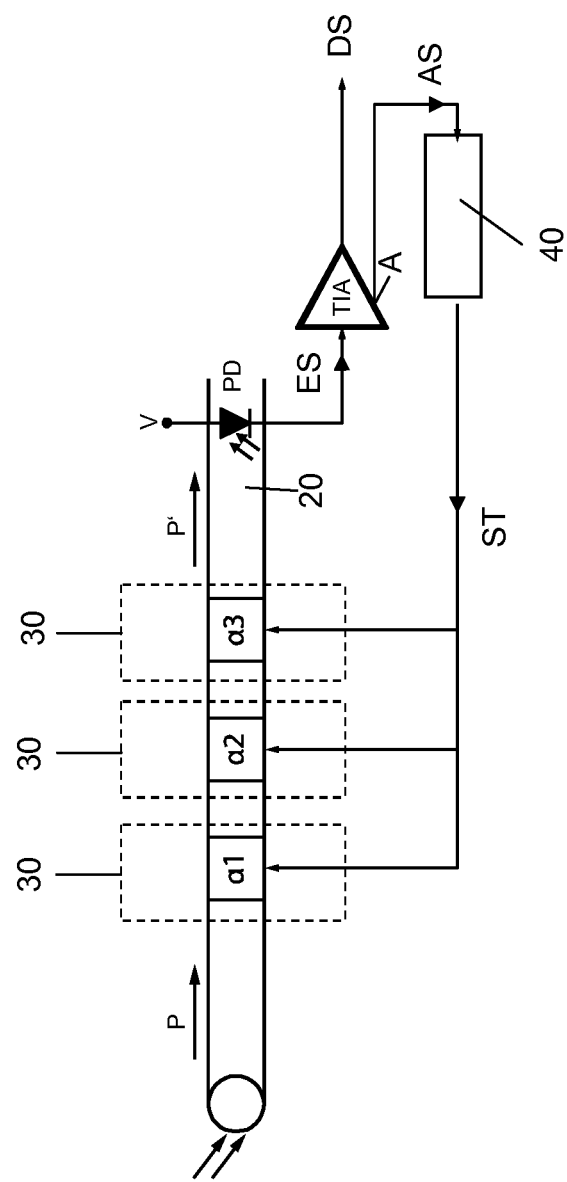
FIG. 5 shows one exemplary embodiment of a component according to the invention in which a plurality of damping members are arranged upstream of a photodetector of the component in the radiation propagation direction.

FIG. 5 shows one exemplary embodiment of an optical component 10 in which—as viewed in the propagation direction of the radiation P in the waveguide 20—three damping members 30 are arranged upstream of a photodetector PD. The three damping members 30 are driven by a control device 40, which sets the damping of the damping members 30 in such a way that the control loop formed by the three damping members 30, the photodetector PD, the amplifier TIA and the control device 40 produces a desired output signal AS at the output A of the amplifier TIA. With regard to the control possibilities or with regard to the possible mode of operation of the control device 40, reference should be made to the explanations above in association with FIGS. 1 to 4, in particular FIG. 1.

Figure 6:
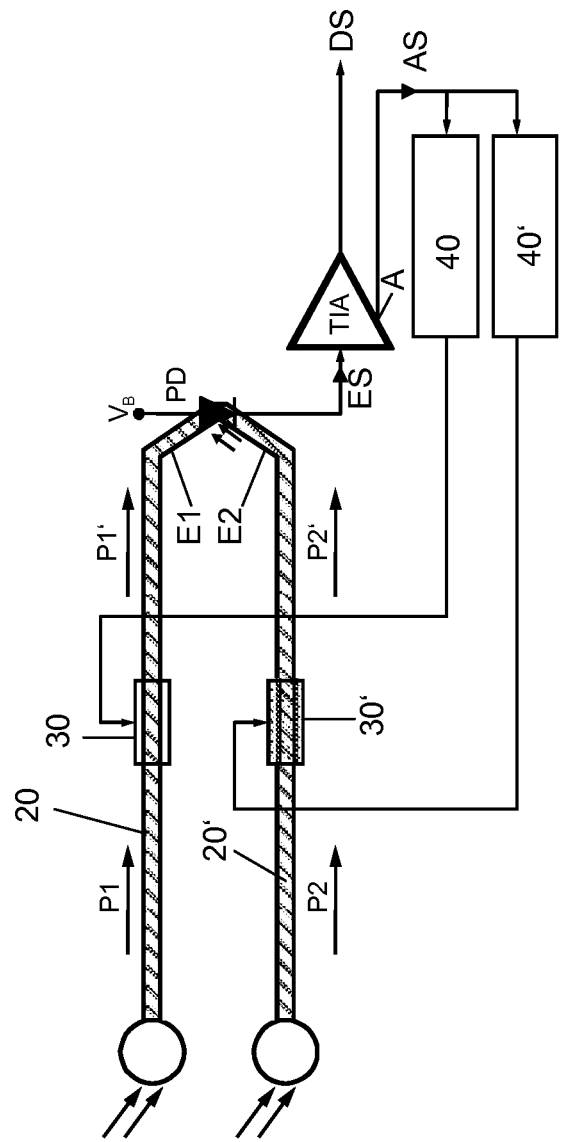
FIG. 6 shows one exemplary embodiment of a component according to the invention in which a photodetector has two inputs, to which a respective waveguide with an integrated damping member is connected, wherein the damping members are driven in each case by an individual control device.

FIG. 6 shows one exemplary embodiment of a component 10 in which a photodetector PD has two optical inputs E1 and E2, to which a respective waveguide is connected. The waveguides are identified by the reference signs 20 and 20' in FIG. 6.

Each of the two waveguides 20 and 20' is equipped with an assigned damping member 30 and 30', respectively.

An amplifier TIA connected to the photodetector PD outputs an output signal AS at an output A, which output signal is evaluated by two control devices 40 and 40'. Each of the two control devices 40 and 40' drives an assigned damping member 30 and 30' in such way that the output signal AS at the output A of the amplifier TIA has a predefined behavior, as has already been explained in detail above in association with FIGS. 1 to 5, in particular FIG. 1.

Figure 7:
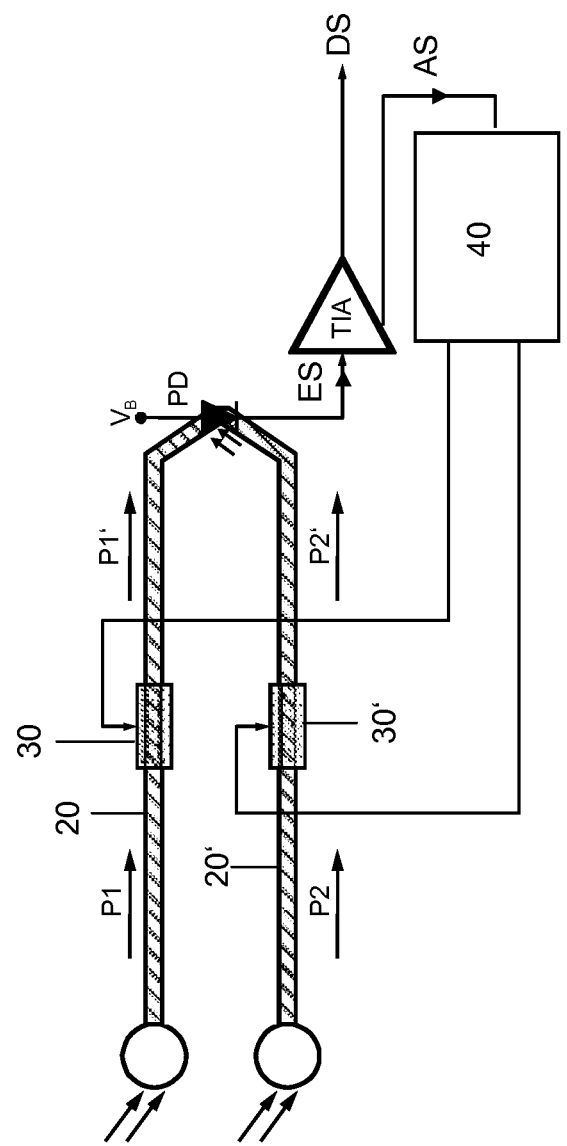
FIG. 7 shows one embodiment variant of the component in accordance with FIG. 6 in which the damping members are driven with a single control device.

FIG. 7 shows a variant of the component 10 in accordance with FIG. 6. In the case of the variant in accordance with FIG. 7, the damping members 30 and 30' are driven by a single control device 40. For the rest, the explanations above are correspondingly applicable.

Figure 8:
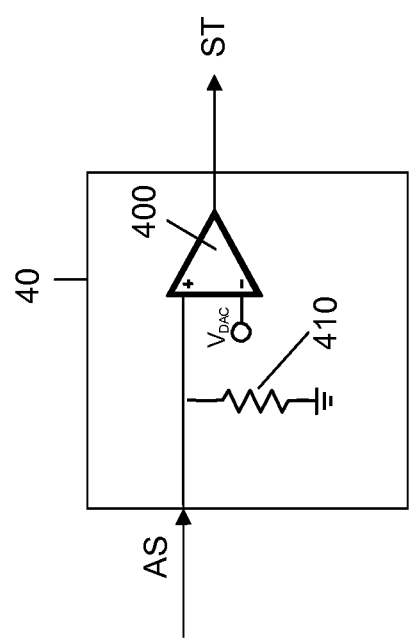
FIG. 8 shows one exemplary embodiment of a control device which can be used in the case of the components in accordance with FIGS. 1 to 7.

FIG. 8 shows one exemplary embodiment of a control device 40 which can be used in the case of the components 10 in accordance with FIGS. 1 to 7. The control device 40 in accordance with FIG. 8 has an operational amplifier 400 and a resistor 410, which are interconnected with one another in the manner shown. The output of the operational amplifier 400 outputs the control signal ST, which acts on a downstream damping member 30 and/or 30', as has been explained in detail above in association with FIGS. 1 to 7.

Figure 9:
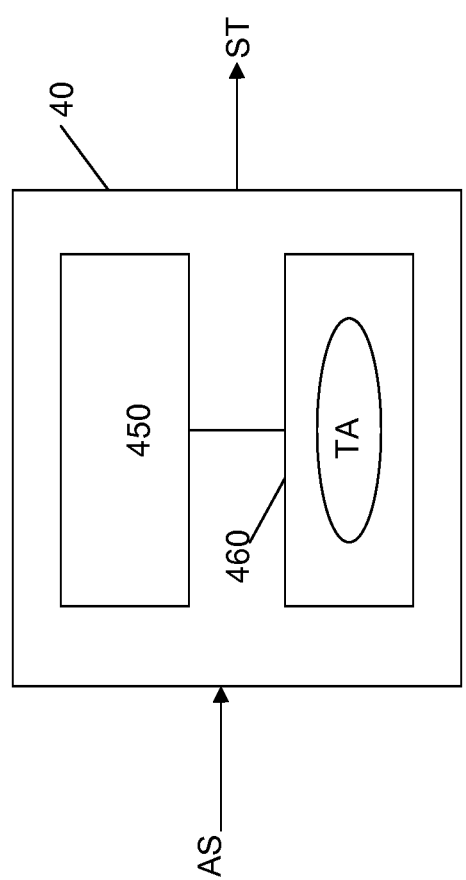
FIG. 9 shows a further exemplary embodiment of a control device which is suitable for use in the case of the components in accordance with FIGS. 1 to 7.

FIG. 9 shows an alternative configuration for a control device 40 which can be used in the case of the components 10 in accordance with FIGS. 1 to 7. The control device 40 in accordance with FIG. 9 has a computing device 50 and a memory 460. A table TA is stored in the memory 460, said table predefining electrical control signals ST to be output depending on an output signal AS output by an upstream amplifier TIA. Depending on the output signal AS, the computing device 450, consulting the memory 460 or the table TA stored therein, will generate a suitable control signal ST and output it on the output side for the purpose of driving a downstream damping member.

Figure 10:
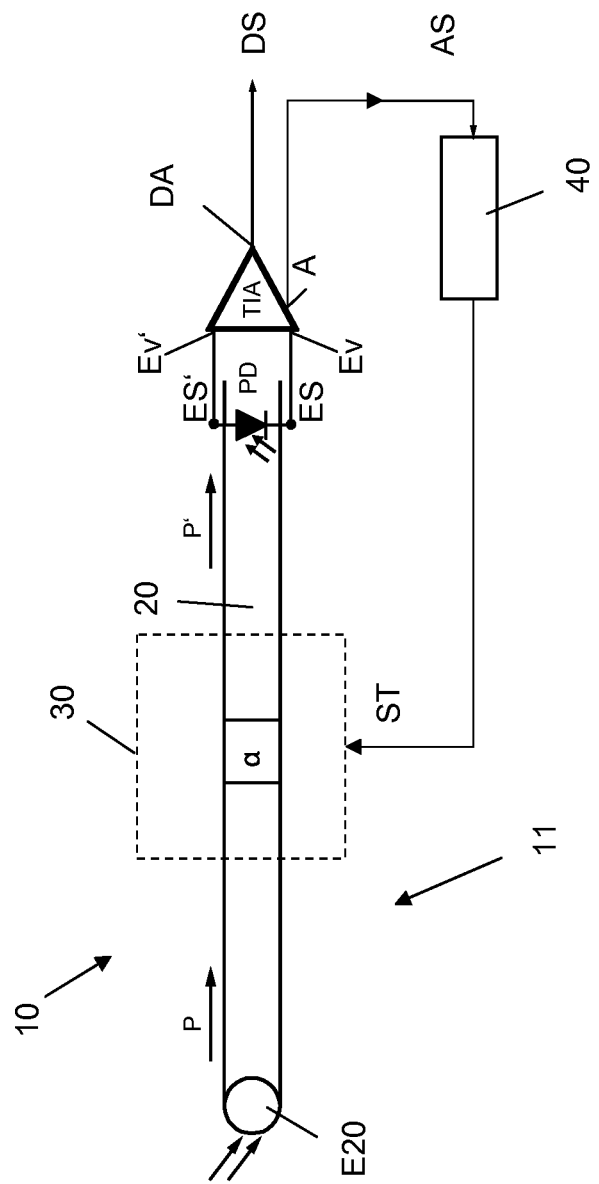
FIG. 10 shows one embodiment variant for a component according to the invention in which a photodetector is deferentially connected to the amplifier.

FIG. 10 shows one embodiment variant for a component 10 according to the invention in which a photodetector PD is differentially connected to the amplifier TIA. For this purpose, the amplifier TIA has two amplifier inputs Ev and Ev', into which a respective input signal ES and ES' of the photodetector PD is fed. For the rest, the explanations above in association with FIGS. 1 to 9 are correspondingly applicable.

To summarize, components and methods in which the optical signal can be attenuated while still upstream of the photodetector are described above in association with the exemplary embodiments in accordance with FIGS. 1 to 11. The amplifier can thus be optimized for maximum sensitivity, without overdriving needing to be feared.

The integration of electronic and photonic elements into one and the same semiconductor substrate 11 (preferably silicon substrate) or on an integrated circuit (EPIC) affords the possibility of optically limiting the input signal ES and thus optimizing the sensitivity of the input stage. The realization is unique in its compactness, cost-effectiveness and avoids a compromise in the sensitivity of the receiver.

The amplifier TIA preferably has a data signal output DA for the data signal DS having a data rate of 25 Gbit/s, for example, and an additional output for the output signal AS. The output signal AS can represent for example the signal strength (received signal strength indicator, RSSI) or the peak amplitude at the amplifier input Ev (peak detector).

Optical data transfer in and between data centers ("intra DC" and "inter DC") and optical data transfer in a metropolitan area network and to the end user ("Fiber to the home, FTTH") constitute possible applications.

The component in accordance with the exemplary embodiments shown in FIGS. 1 to 11 is suitable for optical data transfer for 100 Gbit/s, as is regulated for example by the CWDM4-MSA and by the IEEE standard 100GBase-LR4. In both cases, a large dynamic range is required for the received optical power, from a minimum average power of −11.5 dBm (CWDM4) and −10 dBm (LR4) up to a maximum of 2.5 dBm (CWDM4 and LR4).

The exemplary embodiments described above in association with FIGS. 1 to 11, describing the cointegration of waveguide 20, optical damping member (attenuator) 30, photodetector PD, amplifier TIA and control loop on an EPIC, can have individual, a plurality or all of the properties and/or advantages below:

Limiting the optical input signal ES on the photodetector PD can prevent a distortion of the electrical signals at the data signal output DA and the output A of the amplifier.

The regulation of the output amplitude is possible without changing the gain parameters of the amplifier and thus without reducing the receiver sensitivity.

The sensitivity of the amplifier input stage is increased as a result of a short electrical connection between photodiode and amplifier.

No additional optical insertion losses as a result of the attenuator 30 (or negligible with the use of a p-i-n diode).

No overvoltages in conjunction with high optical input powers.

The optical attenuator can be used in conjunction with high signal values in order to avoid an influence on the sensitivity. Without an optical attenuator, the sensitivity of the amplifier would otherwise have to be adapted by a change in the transimpedance by means of a thyristor, at the expense of the sensitivity.

The entire receiver system described can be realized very compactly.

Short signal propagation times and simplified production with few component parts.

No external optical or electronic component parts need to be used, and so no additional signal losses which are unavoidable as a result of such component parts occur.

The optical attenuator can generate a typical maximum signal suppression of at least 5 dB.

The substrate material of the component (or integrated EPIC chip) can be silicon.

The photodiode can have two or more optical inputs, to which a respective waveguide is connected. The aggregate signal of all the inputs then determines the gain control. In this case, it is both possible for one optical attenuator to regulate the transmission of both waveguides if the latter have been divided from one waveguide, and possible for each waveguide to have a dedicated optical attenuator, as a result of which independent regulation is made possible.

The photodiode can be a Ge-PD.

The photodiode can be electrically differentially connected to the amplifier (TIA).

A change in the phase of the received signal can be carried out by way of the change solely in the refractive index. In combination with a local oscillator as part of a coherent receiver with a balanced photodiode, the operating point can thus be stabilized.

The optical signal can be coupled into the waveguide by way of a grating coupler.

Although the invention has been more specifically illustrated and described in detail by means of preferred exemplary embodiments, the invention is nevertheless not restricted by the examples disclosed and other variations can be derived therefrom by those skilled in the art, without departing from the scope of protection of the invention.

LIST OF REFERENCE SIGNS

10 Component
11 Semiconductor substrate
20 Waveguide
20' Waveguide
30 Damping member
30' Damping member
40 Control device
40' Control device
310 Charge carrier injection device
311 p-doped region
312 n-doped region
313 Central region
320 Mach-Zehnder structure
321 Waveguide arm 322 Waveguide arm
323 Output
330 Ring resonator
331 Waveguide ring
332 Directional coupler
400 Operational amplifier
410 Resistor
450 Computing device
460 Memory
500 Heating element
A Output
AS Output signal
DA Data signal output
DS Data signal
E1 Input
E2 Input
E20 Input
ES Input signal
ES' Input signal
Ev Amplifier input
Ev' Amplifier input
P Radiation/optical power
P' Damped radiation
PD Photodetector
ST Control signal
TA Table
TIA Amplifier
V Potential
α Damping

The invention claimed is:

1. A component (10) comprising a photodetector (PD) and an electrical amplifier (TIA) connected to the photodetector (PD), wherein the photodetector (PD) and the amplifier (TIA) are integrated in the same semiconductor substrate (11),
characterized in that
at least one adjustable optical damping member (30) is arranged upstream of the photodetector (PD) and damps or can at least damp the optical radiation passing to the photodetector (PD),
an electrical output (A) of the amplifier (TIA) is connected directly or indirectly to the adjustable optical damping member (30) and an output signal (AS) of the amplifier (TIA) or a control signal (ST) formed therewith drives the optical damping member (30), and
the photodetector (PD), the amplifier (TIA) and the damping member (30) are integrated in the same semiconductor substrate (11).

2. The component (10) as claimed in claim 1, characterized in that
a control device (40) drives the damping member (30) in such a way that the electrical input signal (ES) at the amplifier input (Ev) of the amplifier (TIA) has a predefined characteristic and/or the amplifier (TIA) exhibits a predefined behavior.

3. The component (10) as claimed in claim 1, characterized in that
a control device (40) drives the damping member (30) in such a way that the average signal strength of the electrical input signal (ES) at the amplifier input (Ev) of the amplifier (TIA) is limited to a predefined maximum value.

4. The component (10) as claimed in claim 1 characterized in that
a control device (40) drives the damping member (30) in such a way that the signal peaks of the electrical input signal (ES) at the amplifier input (Ev) of the amplifier (TIA) are limited to a predefined maximum value.

5. The component (10) as claimed in claim 1, characterized in that
a control device (40) drives the damping member (30) in such a way that the signal strength of the electrical input signal (ES) at the amplifier input (Ev) of the amplifier (TIA) falls below or at least does not exceed a predefined nominal input signal strength.

6. The component (10) as claimed in claim 1, characterized in that
a control device (40) drives the damping member (30) in such a way that the amplifier (TIA) operates in the linear amplifier range or is at least not overdriven.

7. The component (10) as claimed in claim 1, characterized in that
a control device (40) drives the damping member (30) in such a way that an input circuit, in particular a bipolar input transistor, of the amplifier (TIA) is operated with an input voltage below the breakdown voltage thereof.

8. The component (10) as claimed in claim 1, characterized in that
a control device (40) drives the damping member (30) in such a way that an input circuit, in particular a bipolar input transistor, of the amplifier (TIA) is operated with input voltages outside the saturation range thereof.

9. The component (10) as claimed in claim 1, characterized in that
a control device (40) drives the damping member (30) in such a way that the third harmonic in the output signal of the amplifier (TIA) falls below or at least does not exceed a predefined signal threshold for the third harmonic.

10. The component (10) as claimed in claim 1, characterized in that
a control device (40) drives the damping member (30) in such a way that the 1 dB compression point is not reached at the output (A) of the amplifier (TIA).

11. The component (10) as claimed in claim 1, characterized in that
the photodetector (PD), the amplifier (TIA) and the damping member (30) form a closed control loop.

12. The component (10) as claimed in claim 1, characterized in that
a control device (40) is electrically connected between the electrical output (A) of the amplifier (TIA) and the optical damping member (30), the electrical output signal (AS) output at the output (A) of the amplifier (TIA) being applied to said control device on the input side and said control device outputting on the output side the electrical control signal (ST) for driving the optical damping member (30).

13. The component (10) as claimed in claim 12, characterized in that
the photodetector (PD), the amplifier (TIA), the control device (40) and the damping member (30) form a closed control loop.

14. The component (10) as claimed in claim 12, characterized in that
the control device (40) comprises an operational amplifier (400).

15. The component (10) as claimed in claim 12, characterized in that
the control device (40) comprises a memory (460) with a stored table (TA), which predefines electrical control signals to be output depending on the output signal (AS) output by the amplifier (TIA).

16. The component (10) as claimed in claim 1, characterized in that
the electrical output (A) of the amplifier (TIA), which is directly or indirectly connected to the adjustable optical damping member (30), is a signal strength indicator output, which outputs as the output signal (AS) a signal indicating the average signal strength at the amplifier input (Ev) of the amplifier (TIA).

17. The component (10) as claimed in claim 1, characterized in that
the electrical output (A) of the amplifier (TIA), which is directly or indirectly connected to the adjustable optical damping member (30), is a signal peak detector output, which outputs as the output signal (AS) a signal indicating the magnitude of the signal peaks at the amplifier input (Ev) of the amplifier (TIA).

18. The component (10) as claimed in claim 1, characterized in that
the amplifier (TIA) has at least two electrical outputs, namely the output (A) directly or indirectly connected to the adjustable optical damping member (30), and a data signal output (DA) for outputting a data signal (DS).

19. The component (10) as claimed in claim 1, characterized in that
a waveguide (20) is optically coupled or connected to the photodetector (PD) and the optical damping member (30) acts on the waveguide (20), and
the waveguide (20), the photodetector (PD) and the optical damping member (30) are integrated in the same semiconductor substrate (11).

20. The component (10) as claimed in claim 1, characterized in that
the photodetector (PD) has two or more optical inputs (E1, E2), to which a respective waveguide (20, 20') is connected.

21. The component (10) as claimed in claim 20, characterized in that
each of the at least two waveguides (20, 20') connected to the photodetector (PD) is equipped in each case with an adjustable optical damping member (30, 30'), which is coupled indirectly or directly to the or one of the outputs of the amplifier (TIA) and is driven indirectly or directly via an output signal (AS) of the amplifier (TIA).

22. The component (10) as claimed in claim 1, characterized in that
the adjustable optical damping member (30) has a charge carrier injection device (310), in particular a pn or pin diode structure, and/or a heating device.

23. The component (10) as claimed in claim 1, characterized in that
the waveguide (20) has an interference structure, in particular a Mach-Zehnder structure (320) or a directional coupler structure (332), and/or a resonator structure, in particular a Fabry-Perot resonator structure or a ring resonator structure (330), and
the adjustability of the damping of the optical damping member (30) is at least also based on a variation of the refractive index in a section of the interference structure and/or the resonator structure.

24. The component (10) as claimed in claim 1, characterized in that
the amplifier (TIA) is a transimpedance amplifier, in particular one which is integrated in the same substrate (11) as the photodetector (PD).

25. The component (10) as claimed in claim 1, characterized in that
a waveguide (20) is optically coupled or connected to the photodetector (PD), and
in and/or alongside the waveguide (20) two or more optical damping members (30) are arranged one behind another in the longitudinal direction of the waveguide, which damping members act or can at least act in each case on the waveguide (20),
wherein each of the damping members (30) is connected in each case indirectly or directly to the or one of the electrical outputs of the amplifier (TIA), in particular to the same output (A) of the amplifier (TIA), and is driven with an output signal (AS) of the amplifier (TIA), in particular the same output signal (AS), or a control signal (ST) formed therewith.

26. The component (10) as claimed in claim 1, characterized in that
the photodiode (PD) is electrically differentially connected to the amplifier (TIA).

27. A method for operating a component (10) comprising a photodetector (PD) and an electrical amplifier (TIA) connected to the photodetector (PD),
characterized in that
an adjustable optical damping member (30) is driven with an output signal (AS) output at an electrical output (A) of the amplifier (TIA) or with a control signal (ST) formed therewith and the damping of said damping member is set, and
the radiation incident on the photodetector (PD) is damped by the damping member (30),
wherein the photodetector (PD), the amplifier (TIA) and the damping member (30) are integrated in the same semiconductor substrate (11).

28. The method as claimed in claim 27, characterized in that
the damping is set in such a way that the electrical input signal (ES) at the amplifier input (Ev) of the amplifier (TIA) has a predefined characteristic and/or the amplifier (TIA) exhibits a predefined behavior.

29. The method as claimed in claim 27, characterized in that
the damping is set in such a way that the average signal strength of the electrical input signal (ES) at the amplifier input (Ev) of the amplifier (TIA) is limited to a predefined maximum value.

30. The method as claimed in claim 27, characterized in that
the damping is set in such a way that the signal peaks of the electrical input signal (ES) at the amplifier input (Ev) of the amplifier (TIA) are limited to a predefined maximum value.

31. The method as claimed in claim 27, characterized in that
the damping is set in such a way that the signal strength of the electrical input signal (ES) at the amplifier input (Ev) of the amplifier (TIA) falls below or at least does not exceed a predefined nominal input signal strength.

32. The method as claimed in claim 27, characterized in that
the damping is set in such a way that the amplifier (TIA) operates in the linear amplifier range or is at least not overdriven.

33. The method as claimed in claim 27,
characterized in that
the damping is set in such a way that an input circuit, in particular an input transistor, of the amplifier (TIA) is operated with an input voltage below the breakdown voltage thereof.

34. The method as claimed in claim 27,
characterized in that
the damping is set in such a way that an input circuit, in particular a bipolar input transistor, of the amplifier (TIA) is operated with input voltages outside the saturation range thereof.

35. The method as claimed in claim 27,
characterized in that
the damping is set in such a way that the third harmonic in the output signal of the amplifier (TIA) falls below or at least does not exceed a predefined signal threshold for the third harmonic.

36. The method as claimed in claim 27,
characterized in that
the damping is set in such a way that the 1 dB compression point is not reached at the output DS of the amplifier (TIA).

37. The method as claimed in claim 27,
characterized in that
the damping is set in such a way that the output signal (AS) at the output (A) of the amplifier (TIA) does not exceed a predefined threshold value.

* * * * *